United States Patent [19]

Rideout

[11] 4,144,101
[45] Mar. 13, 1979

[54] PROCESS FOR PROVIDING SELF-ALIGNED DOPING REGIONS BY ION-IMPLANTATION AND LIFT-OFF

[75] Inventor: Vincent L. Rideout, Mohegan Lake, N.Y.

[73] Assignee: International Business Machines Corporation, Armonk, N.Y.

[21] Appl. No.: 912,797

[22] Filed: Jun. 5, 1978

[51] Int. Cl.$^2$ .................. H01L 21/265; H01L 21/28; H01L 29/78; B01J 17/00
[52] U.S. Cl. .................................... 148/1.5; 148/187; 156/643; 357/23; 357/91
[58] Field of Search .................. 148/1.5, 187; 357/23, 357/91; 156/643

[56] References Cited

U.S. PATENT DOCUMENTS

| 3,752,711 | 8/1973 | Kooi et al. | 148/33.3 |
| 4,030,942 | 6/1977 | Keenan et al. | 148/1.5 |

OTHER PUBLICATIONS

Fredericks et al., "Polysulfone Lift-Off --- Technique," IBM-TDB, 20, (1977), 989.
Carr et al., "Structure for Lift-Off Mask ---," IBM-TDB, 18, (1975), 1396.
Alcorn et al., "Lift-Off --- Photoresist With Dual Etch ---," IBM-TDB, 20, (1978), 4009.
Fortino et al., "Poly-Si Drain MOSFET ---," IBM-TDB, 20, (1977), 539.
Chiu et al., "Ion-Etch Lift-Off Process," IBM-TDB, 19, (1977), 3409.
Gegenwartt et al., "Capped Cu Lift -Off ---," IBM-TDB, 15, (1973), 3538.
Cuomo et al., "Mask Substrate Surface Shield," IBM-TDB, 15, (1972), 1728.

*Primary Examiner*—L. Dewayne Rutledge
*Assistant Examiner*—Upendra Roy
*Attorney, Agent, or Firm*—Pollock, Vande Sande & Priddy

[57] ABSTRACT

A process for providing ion-implanted regions in a substrate such as silicon beneath an existing layer such as silicon dioxide and being self-aligned to subsequently fabricated regions of said layer which includes providing a resist masking pattern above the existing layer wherein the resist masking pattern has vertical sidewalls (i.e., perpendicular to the upper surface of the substrate) or is undercut; ion-implanting impurities such as boron ions through the layer but not through the resist and portions of the layer beneath the resist; and depositing a layer of lift-off material such as aluminum on the existing layer and on the resist. The implantation step must be performed after providing the undercut resist masking pattern, but before depositing the layer of lift-off material in order to achieve the desired self-alignment feature. Because of the resist profile (i.e., vertical walls or being undercut) no lift-off material is deposited on the sidewalls of the resist and a gap is formed between the resist and that portion of the lift-off material which is above the existing layer. The resist pattern is removed along with the portion of the lift-off material layer deposited thereon. The now-exposed portion of the existing layer located beneath the previous resist pattern is then removed. Finally, the remaining regions of lift-off material are removed from above the regions of the existing layer.

The ion-implanted regions occur in the substrate beneath the remaining portions of the existing layer, are self-aligned to the boundaries of said portions, and correspond to a negative image of the original undercut resist masking pattern.

17 Claims, 17 Drawing Figures

PROCESS FOR PROVIDING SELF-ALIGNED DOPING REGIONS BY ION-IMPLANTATION AND LIFT-OFF

FIELD OF INVENTION

The present invention is concerned with a process for providing doped regions in a substrate beneath preselected regions of an existing layer on said substrate wherein the doped regions are self-aligned to preselected regions of said layer which are subsequently fabricated. In particular, the process of the present invention involves the use of a technique which will be referred to hereinafter as a "lift-off definition" procedure.

BACKGROUND OF THE INVENTION

Providing doping at preselected locations in a semiconductor substrate is employed in numerous types of integrated circuit structures for various reasons. For instance, it might be desirable to provide doping in the channel region of a depletion-mode MOSFET, to provide field doping beneath field isolation regions between devices, to provide doping to function as one electrode of a capacitor of a one-device memory cell, and the like. For convenience, the description of the invention, as well as the problems of the prior art, will be discussed hereinbelow primarily with respect to providing field doping beneath field isolation regions. However, it is understood that the process of the present invention is applicable for providing doping at preselected locations of an integrated circuit in general and is not limited to doping beneath field isolations. Furthermore, the process is applicable to various types of integrated circuits such as MOSFET, bipolar, or MESFET integrated circuits.

An extremely important aspect of integrated circuits is the means provided for electrically isolating adjacent devices on the same substrate. The fabrication step or steps that produce the isolation affects the spacing between devices (i.e., the device packing density) as well as the electrical characteristics of the device. The presence of doping beneath the isolation regions is often referred to as a "parasitic channel stopper" doping and is important for eliminating unwanted conduction due to inversion under the field isolation when lightly doped substrates are employed. The use of lightly doped substrates has been practiced in order to reduce diffused line capacitance which degrades performance as well as reducing hot electron effects which degrade reliability. Along with the channel stopper doping under the field isolation, there is also normally present channel doping in the device areas in order to adjust the gate threshold voltage to an acceptable operating level. One technique employed to provide the channel stopper or "field" doping is to use an extra masking step. This approach has been described by R. J. Whittier, "Semiconductor Memories: The Impact and Momentum of Current Technology", IEEE Electro 76 Meeting Tech. Digest, Session 33, p. 2, Boston, May 11, 1976. The resultant isolation structure, which is shown in FIG. 1, provides a doping region which is not self-aligned to the isolation material (i.e., silicon dioxide). Consequently this technique suffers from the disadvantage of requiring additional area, thus reducing the device packing density, as well as the additional masking operation. The resist regions used to define the isolation regions are located over the isolation regions rather than over the device areas. This technique is sometimes referred to as nonrecessed or "planar" isolation.

In the aforementioned article by Whittier, another isolation technique is described which provides self-alignment of the field doping to the field isolation. This technique is sometimes referred to as selective or local or semirecessed oxidation and is described by P. Richman, U.S. Pat. No. 3,751,722, Aug. 7, 1973, and by E. Kooi, U.S. Pat. No. 3,752,711, Aug. 14, 1973. In order to form a recessed isolation oxide with a self-aligned channel stopper, an oxidation barrier layer such as silicon nitride is delineated in the device regions. Thin silicon dioxide layers may be provided on either side of the silicon nitride layer to aid in its delineation and to prevent damage to the underlying silicon substrate. The resist pattern used to define the device regions also serves as the implantation mask. The resist regions are located over the future device areas.

The semirecessed oxide isolation structure is illustrated in FIG. 2. It has a number of attractive features including self-alignment of the field doping and field isolation, the use of only one masking step, and improved planarity. However, this procedure still presents a number of disadvantages. For instance, the presence of the oxidation barrier layer such as the nitride over the device regions may cause strain and thus permanently damage the device regions during the thermal oxidation required to form the field isolation. In addition, the device area is undesirably reduced and the field isolation area undesirably increased by lateral oxidation or what is commonly termed in the art as the "Bird's Beak Effect" and described by E. Bassous, H.N. Yu, and V. Maniscalco, "The Formation of Bird's Beak in Si Structure with Recessed $SiO_2$", Extended Abstracts, pp. 457–458, ECS Fall Meeting, Dallas, Oct. 5–10, 1975. Moreover, the procedure requires additional layers of silicon dioxide (substrate protection), silicon nitride (oxidation barrier layer), and silicon dioxide (defining oxide layer) in order to protect and define the device regions. Furthermore, the removal of the defining oxide layer affects the thickness of the recessed oxide or its lateral extent, particularly when a relatively thick oxide layer is required as in a fully-recessed oxide isolation region formed as described, for example, by R. H. Dennard, V. L. Rideout, and E. J. Walker, U.S. Pat. No. 3,899,363, Aug. 12, 1975.

In comparing the planar isolation of FIG. 1 with the recessed isolation of FIG. 2, the self-aligned field doping of the recessed oxide technique occurs because the resist masking pattern that defines the field and device regions is located over the device regions and can thereby also serve as an implantation mask to prevent the field doping from entering the device regions. The field oxide is formed locally by a thermal oxidation. With the planar isolation technique, the resist masking pattern is located over the field regions, and device areas are revealed by locally etching away silicon dioxide in the device areas. Accordingly, it is an object of the present invention to provide the simplicity of planar isolation (i.e., no silicon nitride or Bird's Beak problems) but with a self-aligned field doping in one lithographic pattern delineation step.

One approach to the problem of providing planar isolation with field doping is that of R. H. Dennard and V. L. Rideout, "N-Channel MOSFETS having a Common Field-Channel Implant", IBM Tech. Bulletin, Vol. 18, pp. 1289–91. September 1975, in which a common field isolation and device channel doping is provided in a single step. Although attractively simple, this process has the disadvantage that the channel doping controls the field doping. Often one would like the field doping to exceed the channel doping by a factor of five to ten times to enhance the isolation protection in the field region. Accordingly, it is a further object of the present invention to decouple the field isolation doping from the device channel doping for the purpose of improving the field isolation characteristic.

It is important to employ as few masking steps as possible since the lithographic masking steps involved in preparing integrated circuits are among the most critical. The lithographic masking steps require high precision and registration and extreme care in execution. Each additional lithographic masking step in a process introduces possible surface damage due to mask defects, and increases mask-to-mask registration problems that decrease the processing yield and accordingly significantly increases the fabrication cost. Although other factors affect the yield and cost, such as, for example, the number of high temperature heat treatments, a basic objective in FET integrated circuit fabrication is to minimize the number of basic lithographic masking steps required to produce a particular integrated circuit array of desired device structures. Consequently, a further object of the present invention is to provide a process wherein the incorporation of the doping beneath the preselected isolation regions and the fabrication of the isolation regions requires only a single lithographic masking operation.

SUMMARY OF THE INVENTION

The present invention is concerned with a process for providing ion-implanted doped regions in a substrate beneath preselected regions of an existing layer on said substrate wherein the doped regions are self-aligned to preselected subsequently fabricated regions of the existing layer. The process includes providing a first layer of a material such as silicon dioxide on a semiconductive substrate such as silicon.

Ion-implanted doped regions are to be subsequently formed beneath preselected portions of the first layer. A resist masking layer is provided above the first layer. The resist masking layer has vertical sidewalls (i.e., perpendicular to the upper surface of the substrate) or preferably is undercut. Active impurities such as boron ions are ion-implanted through the first layer in those regions not covered by the resist masking material in order to provide ion-implanted regions beneath the first layer. The relative thickness of the first layer and the combined thicknesses of the resist mask and first layer beneath it are such that the resist mask and portion of the first layer beneath it prevent the implanted ions from penetrating completely therethrough.

A layer of lift-off material such as aluminum is deposited on the first layer and on the resist layer by a directional deposition technique such as sputtering or evaporation. The thickness of the layer of lift-off material is less than the thickness of the resist. In view of the relative thicknesses of the layer of lift-off material and resist, the profile of the resist and method of deposition of the lift-off material, no lift-off material deposits on the sidewalls of the resist and a gap is formed between the resist layer and that portion of the lift-off material which is above the first layer but not above the resist layer. The resist layer is removed such as by dissolving in a solvent. The layer of lift-off material which was deposited on the resist layer is concomitantly removed along with the resist layer. The portion of the first layer which was beneath the resist layer is removed by etching such as by plasma etching. Then, the remainder of the lift-off material is removed from above the first layer by dissolving in a solvent. In this manner, ion-implanted regions in the substrate are obtained which are self-aligned at the edges to the boundaries of preselected fabricated regions of the first layer located above the ion-implanted regions.

It is essential in the present invention to carry out the ion-implanted step after the resist pattern is formed but before the lift-off layer is deposited. By use of the techniques of the present invention, the masking pattern is actually reversed from over the device region before implantation to over the field isolation region after implantation.

DESCRIPTION OF PREFERRED EMBODIMENTS

For convenience, the discussion of the unique fabricating steps of the present invention is directed to providing field doping in a planar silicon dioxide isolation process. It is understood, of course, that the steps are applicable for providing ion-implanted regions beneath preselected regions of an existing layer on a substrate when the aspects of self-alignment along with minimal masking steps are desired. In addition, the discussion of the fabrication steps is directed to the preferred aspect of employing a p-type silicon substrate as the semiconductive substrate and a p-type impurity as the implanted dopant species. This leads to the n-channel FET technology. Accordingly, it is understood that an n-type substrate and n-type implanted dopant impurities can be employed according to the present invention in the p-channel FET technology.

It is understood that when the discussion refers to n-type impurities, the process is applicable to p-type impurities and vice versa. Also, the present invention is applicable to substrates other than silicon. Moreover, as used herein, the terms "metallic-type interconnection lines" or "high-conductivity interconnection lines" refer to metal lines such as aluminum as well as to nonmetallic materials (e.g., highly doped polysilicon or intermetallic silicides) which nevertheless can have conductivities of the magnitude generally possessed by conductive metals. Moreover, the terms "polysilicon" and "polycrystalline silicon" are used herein interchangeably as in the prior art. Furthermore, when reference is made to impurities of a "first type" and to impurities of the "second type" it is understood that the "first type" refers to n- or p-type impurities and "second type" refers to the opposite conductivity type. That is, if the "first type" is p, then the "second type" is n. If the "first type" is n, then the "second type" is p.

Figure 1:
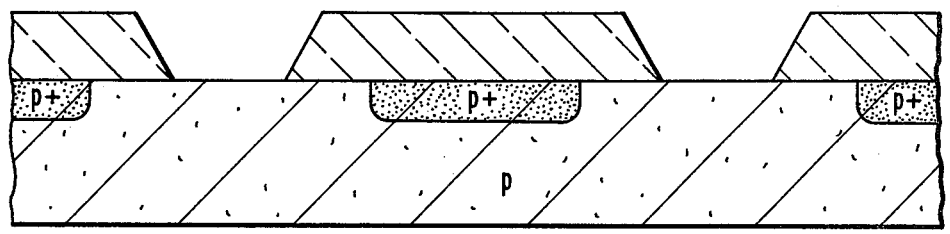
FIG. 1 illustrates a planar isolation with a non-self-aligned field doping prepared by prior art procedures using two masking operations.
Figure 2:
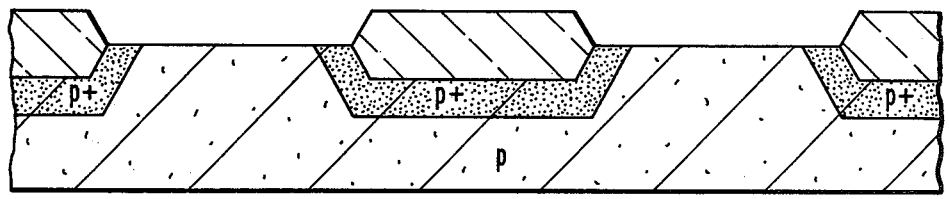
FIG. 2 illustrates a semirecessed oxide isolation with a self-aligned field doping prepared by prior art procedures using one masking operation.
Figure 3:
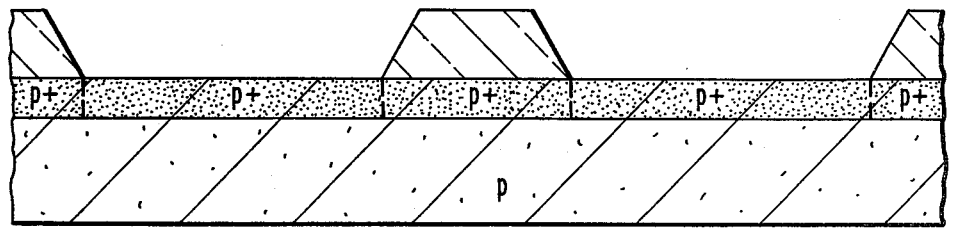
FIG. 3 illustrates a planar isolation with a common field and device channel doping prepared by prior art procedures using one masking operation.
Figure 4A:
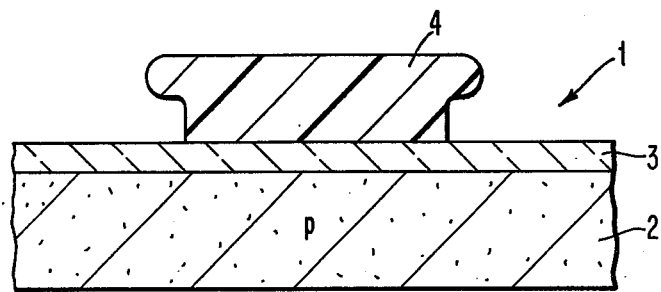
FIGS. 4A–4F are cross-sectional views illustrating various stages of fabrication according to the present invention.
Figure 4B:
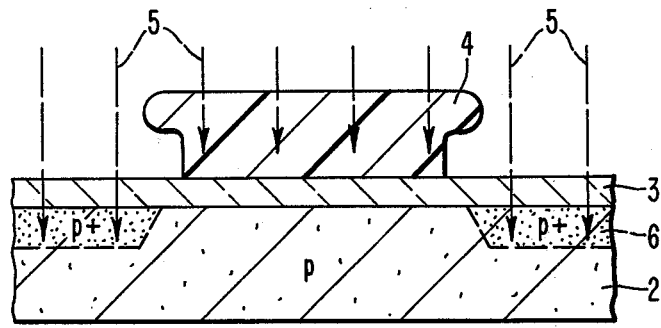

Referring to FIG. 4A, there is shown a fragment of initial structure generally shown as 1. A p-type silicon substrate 2 such as one having about 10–15 ohm-cm resistivity and having any desired crystal orientation (e.g., <100>). The substrate can be prepared by slicing and polishing a p-type silicon boule grown in the presence of the p-type dopant such as boron following conventional crystal growth techniques. Other p-type dopants for silicon include aluminum, gallium, and indium.

Next, a relatively thin silicon dioxide layer 3 of about 1500 to about 5000 angstroms and preferably about 2500 to about 4000 angstroms is grown by wet thermal oxidation such as oxidation at about 900° to 1000° C. in the presence of steam. This is referred to as the initial field oxide thickness as it is not the final field oxide thickness.

Next, the resist is applied and exposed to radiation incident through a masking pattern to provide the preselected pattern in the resist layer. The material of the resist 4 and/or the method of exposure and development are selected in order to provide a pattern wherein the edges or sidewalls of the resist pattern are vertical or are preferably undercut as illustrated in FIG. 4A. In other words, the sidewalls cannot spread out or flare out at the bottom adjacent to the substrate. Stated another way, the area of the lower surface of the resist which is in contact with layer 3 equals or is less than the area of at least some portion of the resist pattern 4 located above said lower surface. For convenience, the part of the resist pattern 4 located above said lower surface can be referred to as the upper portion of the resist pattern 4. Undercutting can be achieved, for example, by employing two different resist materials wherein the portion adjacent the oxide layer 3 is more sensitive to the exposure or developing technique. Accordingly, greater amounts of it are removed as compared to the upper portion of the resist. In addition, a resist material which results in faster etching of the material closest to the oxide layer as compared to that further away could also be used. If desired, the technique employed can be such that the exposure varies with respect to the depth such as when electron-beam exposure is employed. In such a technique, electrons will back-scatter from the oxide layer thereby exposing additional amounts of that material closest the oxide layer. The techniques employed for providing undercut are well known and need not be described in any greater detail herein. The undercut resist masking layer may be of polymethyl methacrylate material and exposed with electron beam radiation (see M. Hatzakis, Journal of the Electrochemical Society, Volume 116, p. 1036, July 1969), or of other undercut resist materials. When using an undercut masking layer, it is typical to undercut in at the sidewalls at least about 0.1 microns per each micron of thickness of the resist layer. Also, it is typical when using an undercut layer to provide for undercutting in at least 50% and generally about 90% of the total thickness of the resist layer.

The resist layer is generally about 5000 to about 15000 angstroms thick, preferably about 10000 angstroms thick and usually thicker than or at least equal to the thickness of the oxide layer beneath it through which the ion implantation is to proceed. A typical resist material is polymethyl methacrylate which is spun onto the substrate. After exposure, the substrate is baked at about 170° C. for 15 minutes. The sample is exposed to a scanning electron beam exposure to provide the desired pattern of resist. The resist pattern is developed by soaking in a solution of alcohol and ketone.

Next, a p-type dopant such as boron ions 5 is ion-implanted. Boron ions can be implanted, for instance, at about 150 Kev energy at a dosage of about $5 \times 10^{12}$ atoms/cm$^2$ providing a field surface doping 6 of about 2 ohm-cm. Boron ions at 150 Kev energy have a range of about 4000 angstroms and a standard deviation of about 700 angstroms.

In this step, the resist layer 4 acts as an implantation mask in that the ions will not pass through both the resist layer 4 and the thermal oxide layer 3 beneath it but will pass through that portion of the oxide layer 3 not covered by the resist material 4. For instance, if the oxide layer is about 2500 angstroms thick, about 98.4% of the implanted dose will penetrate the oxide but none of the boron will penetrate the 10000 angstroms thick resist plus the 2500 angstroms of oxide in the subsequently formed device regions.

Next, the layer of lift-off material 7 (see FIG. 4C) is deposited by employing a technique which deposits it in a directional manner so as not to coat the sidewalls of the resist pattern and so as to provide a gap 8 between the resist layer and that portion of the lift-off material not above it. The lift-off material must be a material different than the resist material and must not be removable by the same means (e.g., same etchant) employed to remove the resist material.

The lift-off material 7 must be different than the material of the existing layer 3 beneath it. The lift-off material 7 can be a metal such as aluminum, titanium, or tungsten; polycrystalline silicon, silicides, an oxidation barrier layer such as silicon nitride; and silicon oxides. The preferred lift-off material is aluminum. The lift-off layer of aluminum is applied by a directional deposition technique such as evaporation or sputtering. The technique and material employed must be such that a directional deposition is provided so that coating of the sidewalls of the resist does not occur and the gap as illustrated is provided all around the resist region in order that the lift-off technique can be subsequently employed.

Figure 4C:
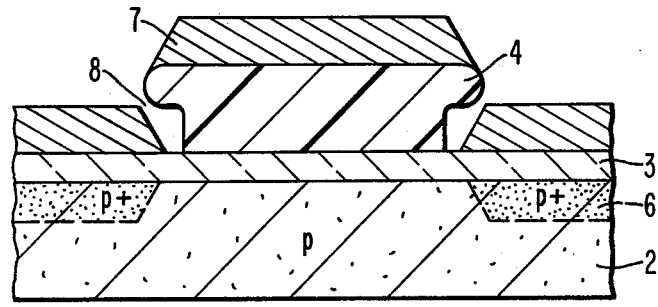

The lift-off layer 7 must be thinner than the resist layer 4 so that the desired gap 8 is present between that portion of the lift-off layer which remains on top of the oxide layer and the remaining portions of the resist material (see FIG. 4C). In addition, the thickness of the layer of lift-off material must be such that it will act as a mask in a subsequent removal of the desired portions 9 of the oxide layer 3. The lift-off material is generally from about 2000 to about 7500 angstroms. For instance, the lift-off layer may be about 5000 angstroms thick when employing a resist layer of about 10000 angstroms thick.

Figure 4D:
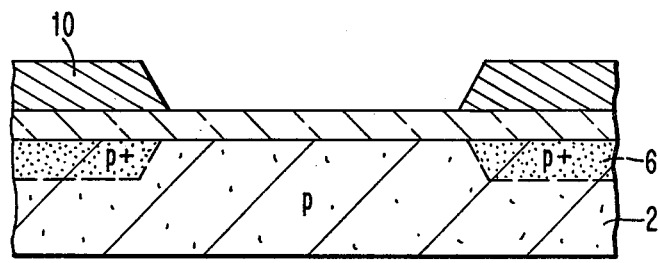

The resist layer 4 is removed by a conventional means such as by dissolving in an etchant such as hot trichloroethylene which does not chemically react with the lift-off material. Upon removal of the resist layer such as by dissolution in an etchant, the lift-off material above it will also be removed as shown in FIG. 4D.

Figure 4E:
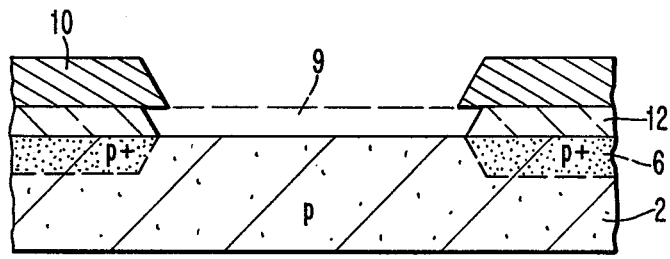

The lift-off material 10 remaining on the field oxide layer is now suitable as a mask for removal or preselected portions 9 of the oxide layer 3. The preselected portions of oxide layer 3 can be removed by any suitable means such as plasma or reactive ion-etching, or by use of chemical etchants such as buffered HF, or by a combination of these techniques as shown in FIG. 4E.

Figure 4F:
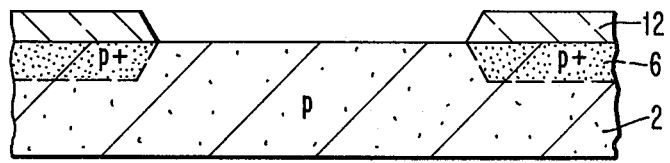

The remaining lift-off material 10 can now be removed by employing a suitable etchant which will remove the lift-off material but not attack the other layers of the article as shown in FIG. 4F.

As illustrated in FIG. 4F, the resulting structure includes doped regions 6 beneath the field isolation regions 12 wherein the doped regions are self-aligned at the edges to the field oxide regions.

Figure 5A:
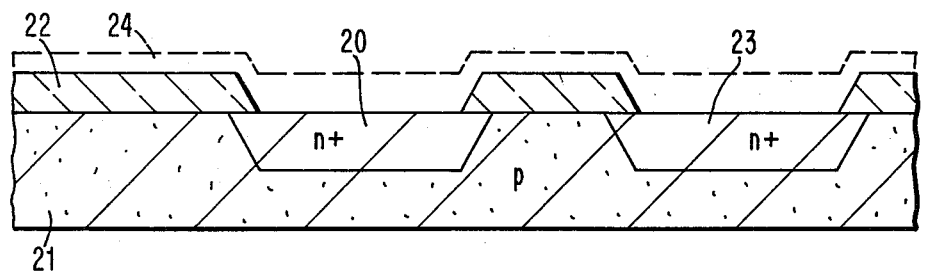
FIGS. 5A–5D are cross-sectional views of a metal gate FET in various stages of fabrication employing the technique of the present invention.

Reference to FIGS. 5A-5D illustrates preparation of a metal gate FET employing the process of the present invention. FIG. 6A-6D illustrate masking steps employed in certain of the steps in the preparation of said metal gate FET. FIGS 5A and 6A illustrate a p-type silicon substrate 21 containing an initial field oxide layer 22 of silicon dioxide of about 1500 to about 5000 angstroms located at preselected locations on said substrate. In addition, n-type phosphorus dopants were diffused at preselected locations 20 and 23 in substrate 21. These n-type dopants are to be used subsequently as source and drain regions of the FET. An additional thermal oxide layer 24 is grown over the entire substrate. Next, using the previously-described method, a resist preferably having undercut portions is provided on preselected portions of the oxide. P-type ions 15 such as boron are then implanted through the oxide layer into the silicon substrate at all locations except for those beneath the combination of the resist material and oxide layer.

The boron ions provide a parasitic channel stopper except in those regions 16 where the n+ source and drain regions overlap the p+ channel stopper. The doping concentration of the n+ regions is greater than that of the p+ channel stopper by about 100 times or more, typically about 1000 times.

A layer of lift-off material such as a metal is deposited on the resist layer and other portions of the substrate in the manner described hereinabove so that a gap is formed between the resist layer and that portion of the lift-off material on the oxide. The resist layer is now removed by dissolving which in turn removes the lift-off layer above it. Next, the oxide which was previously covered by the resist layer is removed by etching it away down to the substrate. The remainder of the lift-off material is now removed by dissolving.

Figure 5B:
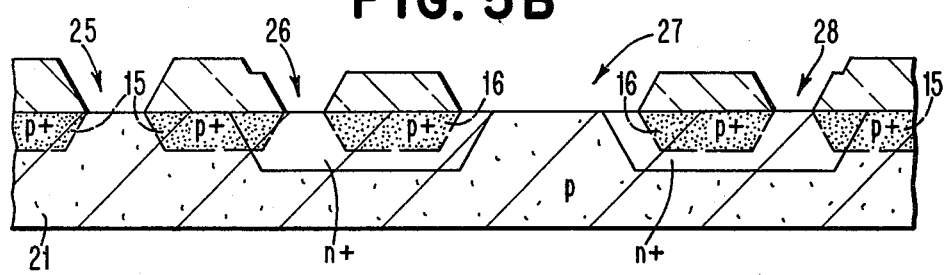
Figure 5C:
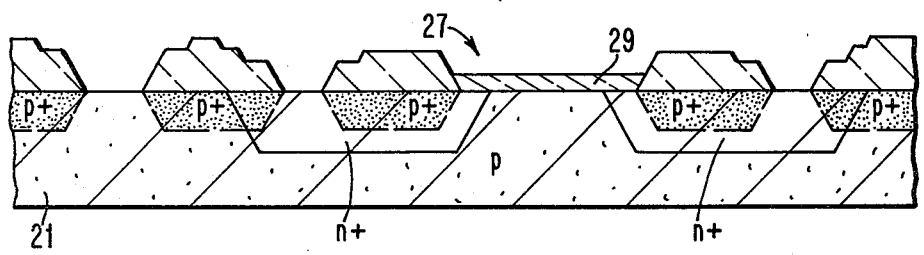
Figure 5D:
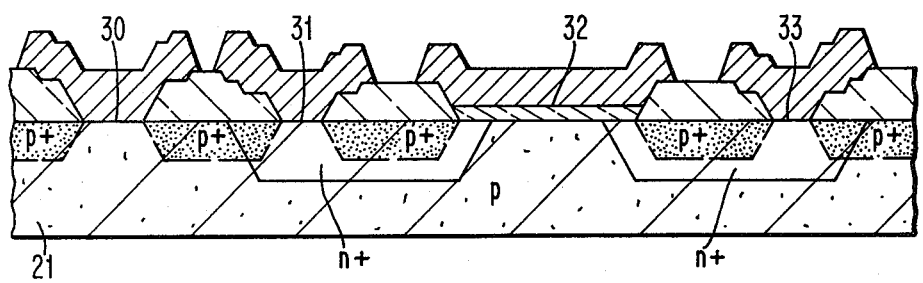
Figure 6A:
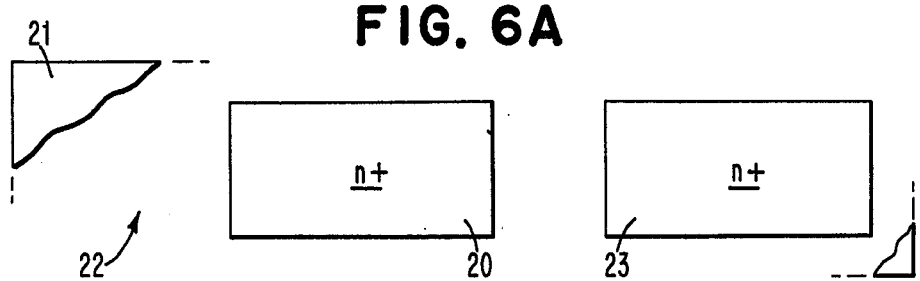
FIGS. 6A–6D illustrate top views of the basic lithographic masks of a metal gate FET in various stages of fabrication employing the technique of the present invention.
Figure 6B:
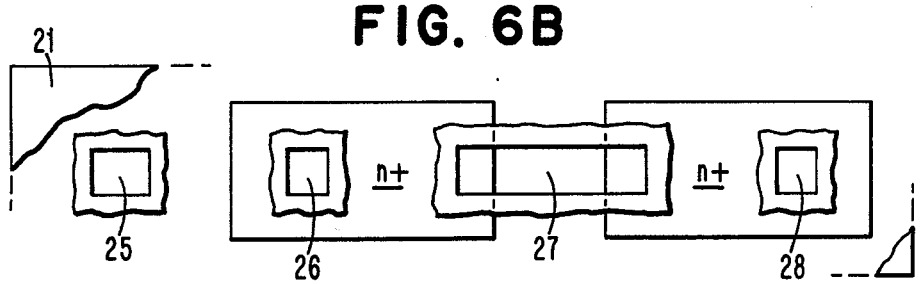
Figure 6C:
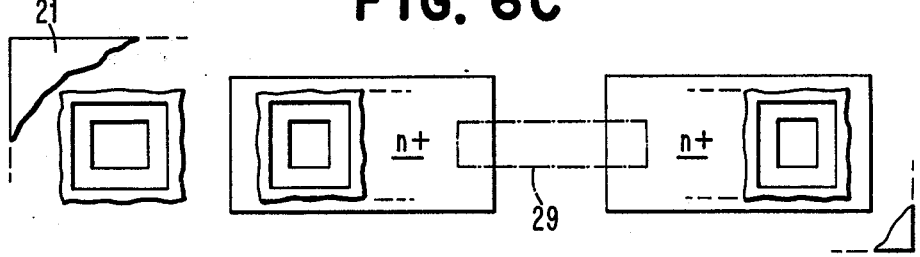

As shown in FIG. 5B, openings 25, 26, 27, and 28 in the field oxide 22 and insulation oxide 24 are now provided using the masking pattern shown in FIG. 6B. These openings will subsequently provide the substrate contact 30, the FET source contact 31, the FET gate 32, and the FET drain contact 33. Then a 650 angstroms thick oxide layer is regrown in the openings 25, 26, 27, and 28. The masking pattern shown in FIG. 6C is used to preserve the FET gate insulator 29 only in the desired region 27.

Figure 6D:
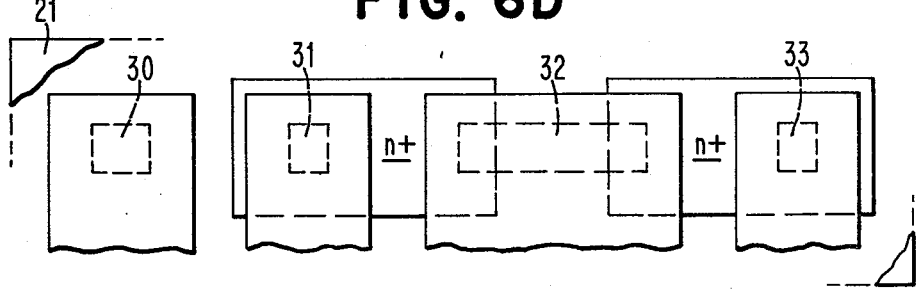

Using the masking pattern shown in FIG. 6D, the metal pattern is formed to provide an ohmic contact 30 to the substrate 21, ohmic contact 31 to the FET source 23, ohmic contact 33 to the FET drain, and to provide the FET gate 32. Well known passivation, dicing, and bonding operations (not shown) complete the integrated circuit.

Although the above procedure has been described with reference to metal gate technology, it is understood, as discussed hereinabove, that the process of the present invention is particularly suitable in polysilicon gate and bipolar transistor technologies as well.

What is claimed is:

1. A process for providing ion-implanted regions in a semiconductive substrate beneath preselected regions of an existing layer on said substrate and self-aligned to preselected subsequently fabricated regions of said layer which comprises:
   A. providing a semiconductive substrate;
   B. providing a first layer of a material above said substrate, beneath preselected portion of which is to be subsequently formed said ion-implanted regions;
   C. providing a resist mask above said layer wherein the sidewalls of said resist mask are perpendicular to the upper surface of the substrate or are undercut;
   D. ion-implanting impurities through said layer in those regions not covered by said resist mask, to provide ion-implanted regions beneath said first layer; the relative thickness of said layer and the combined layer and resist mask being such that the resist mask and portion of said layer beneath it are sufficiently thick so as to prevent ions from penetrating therethrough;
   E. depositing by sputtering or evaporating a layer of lift-off material on said first layer and said resist layer wherein the thickness of said layer of lift-off material is less than the thickness of said resist to a sufficient extent that no lift-off material is deposited on the sidewalls of said resist and a gap is formed between the resist layer and the portion of the lift-off material which is above said first layer but not above said resist layer;
   F. removing said resist layer by dissolving and thereby also removing along with said resist layer, said layer of lift-off material which was deposited on said resist layer;
   G. removing that portion of said first layer which was beneath said resist layer;
   H. removing said layer of lift-off material from above said first layer; and
   I. obtaining thereby ion-implanted regions self-aligned at the edges to preselected fabricated regions located above the ion-implanted regions.

2. The process of claim 1 wherein the sidewalls of said resist mask are undercut.

3. The process of claim 1 wherein said semi-conductive substrate is a silicon substrate.

4. The process of claim 1 wherein said semi-conductive substrate is a p-type silicon substrate.

5. The process of claim 1 wherein said first layer is a layer of silicon dioxide.

6. The process of claim 4 wherein said layer of silicon dioxide is provided by wet thermal oxidation.

7. The process of claim 1 wherein said resist mask in step C is provided by employing two different resist materials wherein the portion adjacent the said first layer is more sensitive to the exposure or developing technique thereby greater amounts of its are removed as compared to the upper portion of the resist.

8. The process of claim 1 wherein said resist mask is provided by employing electron-beam exposure wherein electrons will back scatter from said first layer thereby exposing additional amounts of that material closest the said first layer.

9. The process of claim 1 wherein said resist mask is provided by exposing a layer of polymethyl methacrylate to electron beam radiation.

10. The process of claim 1 wherein the resist layer is at least as thick as the said first layer.

11. The process of claim 1 wherein said resist mask is thicker than said first layer.

12. The process of claim 1 wherein said resist material is thicker than said lift-off material.

13. The process of claim 1 wherein the etching properties of said lift-off material are different than the etching properties of said first layer.

14. The process of claim 1 wherein said lift-off material is selected from the group consisting of metal, polycrystalline silicon, silicides, oxidation barrier materials, and mixtures thereof.

15. The process of claim 1 wherein said lift-off material is selected from the group consisting of aluminum, titanium, tungsten, and mixtures thereof.

16. The process of claim 1 wherein said lift-off material is aluminum.

17. The process of claim 1 wherein said first layer is a silicon dioxide layer of about 2500 angstroms, said resist layer is about 10000 angstroms, and said lift-off material is about 5000 angstroms.

* * * * *

UNITED STATES PATENT AND TRADEMARK OFFICE
CERTIFICATE OF CORRECTION

PATENT NO. : 4,144,101
DATED : March 13, 1979
INVENTOR(S) : Vincent L. Rideout

It is certified that error appears in the above-identified patent and that said Letters Patent are hereby corrected as shown below:

In the Specification:

Column 6, line 13, after "ohm-cm" insert --resistivity--.

Column 6, last line, change "or" to --of--.

Column 7, line 2, after "portions" insert --9--.

Signed and Sealed this

Second Day of October 1979

[SEAL]

Attest:

RUTH C. MASON
Attesting Officer

LUTRELLE F. PARKER
Acting Commissioner of Patents and Trademarks